United States Patent [19]

Nicia

[11] Patent Number: 4,744,087
[45] Date of Patent: May 10, 1988

[54] DEVICE FOR DRIVING A LASER

[75] Inventor: Antonius J. A. Nicia, Eindhoven, Netherlands

[73] Assignee: U.S. Philips Corporation, New York, N.Y.

[21] Appl. No.: 928,147

[22] Filed: Nov. 7, 1986

[30] Foreign Application Priority Data

Jun. 11, 1986 [NL] Netherlands .................. 8601510

[51] Int. Cl.$^4$ ............................................. H01S 3/00
[52] U.S. Cl. ...................................... 372/38; 372/26; 372/29; 372/33
[58] Field of Search ..................... 372/38, 33, 26, 29

[56] References Cited

U.S. PATENT DOCUMENTS 4,539,686  9/1985  Bosch et al. ................... 372/38

OTHER PUBLICATIONS

Swartz et al., "Stabilized . . . Semiconductor Lasers"; The Bell System Technical Journal, vol. 62, No. 7, Part 1; 09/1983; pp.1923-1936.

Primary Examiner—James W. Davie
Assistant Examiner—Xuan Vo
Attorney, Agent, or Firm—David R. Treacy; Bernard Franzblau

[57] ABSTRACT

A device for driving a laser (2) includes a quiescent-current means (3) which supplies, under control of a negative feedback current ($I_D$) from a photodetector (9), a quiescent current ($I_B$) to the laser in order to stabilize the laser light output at a level corresponding to a logic one value of a digital input signal (D). A modulation device (10), which comprises a converter, is responsive to the digital input signal to supply a first drive current ($i_{M1}$) to modulate the laser. The modulation device supplies a second drive current ($i_{M2}$), complementary to the first drive current, to a compensation device (20) which, for a logic zero signal, applies a compensation current ($I_C$) to the quiescent current means thereby to reduce the light level.

9 Claims, 2 Drawing Sheets

DEVICE FOR DRIVING A LASER

BACKGROUND OF THE INVENTION

This invention relates to a device for driving a laser with a digital input signal, comprising:

quiescent-current means for applying to the laser a quiescent current which is controlled by a negative feedback current which is proportional to the light output of the laser in order to stabilize the light output of the laser at a level which corresponds to one of the two possible values of the digital input signal, a modulation device for applying to the laser a drive current modulated by the digital input signal, and a compensation device for applying a compensation current to the quiescent current means in order to compensate for a d.c. component of the drive current, which component varies with the duty cycle of the digital input signal.

Such a device is suitable for use in optical transmission systems and is very suitable for use in digital optical telecommunication systems.

Such a device is known from "The Bell System Technical Journal", Vol. 62, Sept. 1983, No. 7, Part 1, pages 1923–1935. The driving characteristic of an injection laser usually has a first range of gradual slope in which the light output of the laser increases only slightly as the drive current increases and which above a specific threshold value changes into a second range of steeper slope in which the light output increases substantially as the drive current increases. Generally the quiescent-current means ensure that the laser is operated near the threshold value so that, at the operating point, the light output of the laser corresponds to a logic "0" of the digital input signal. In the case of a logic "1" of the input signal, the drive current supplied to the laser by the modulation device then switches the light output of the laser to a higher level. In order to stabilize the light output corresponding to logic "0" with respect to variations in and changes of the laser characteristics, the quiescent current of the laser is controlled by a negative feedback current which is proportional to the light output of the laser and which is obtained by means of a photodetector. However, this negative feedback also eliminates the low-frequency component of the drive current. In order to prevent a digital input signal comprising mainly logic "ones" from driving the laser below its threshold value, a compensation current is added to the quiescent current in the known device, which compensation current is proportional to the drive current from the modulation device. In the case of an input signal comprising many "ones", this compensation current causes the operating point of the laser to increase from a point near the threshold value to a point where the light output of a laser substantially corresponds to that of a logic "1".

However, a drawback of the known device is that the current which is required for compensation and which is proportional to the quiescent current cannot be tapped from this drive current because this would result in the drive current for the laser being adversely affected by the compensation device. For generating the compensation current the known device comprises a second modulating device which, like the first modulation device, is controlled by the digital input signal. This second modulation device, however, requires the use of a second high-frequency circuit in the device, which demands a critical design of the circuit in order to prevent both the drive current and the compensation current from being disturbed. Therefore, it is an object of the invention to provide a device for driving a laser which does not require the high-frequency part of the circuit to be extended in order to generate the compensation current. In accordance with the invention, a device of the type defined in the opening paragraph is characterized in that the quiescent-current means stabilize the light output of the laser at a level corresponding to the high value of the digital input signal, the modulation device comprises a converter for converting the digital input signal into two drive currents having signal components of equal amplitudes but in phase opposition, and one drive current applied to the laser input and the other drive current is supplied to a control input of the compensation device. In the device in accordance with the invention the quiescent current ensures that the laser is not operated at a point where the light output corresponds to a logic "0", but at a point where the light output corresponds to a logic "1". In the case of a logic "0" a compensation current is added to the quiescent current to lower the operating point to a point near the threshold value of the laser. The compensation current required for this purpose is obtained simply by constructing the modulation device as a convertor having one output that supplies the drive current for the laser and with its other output supplying a current which is equal but in phase opposition to the drive current. A fraction of the latter current is now employed as the compensation current. The drive current and the compensation current are generated by a single modulation device so that it is not necessary to extend the high-frequency part of the device in order to obtain the compensation current.

A simple and suitable converter can be obtained in an embodiment which is characterized in that the converter is a differential amplifier comprising two emitter-coupled transistors whose bases are coupled to input terminals for receiving the digital input signal and whose collectors are coupled to output terminals for supplying said one and said other drive current.

A further embodiment may be characterized in that the compensation device is an operational amplifier having an inverting input, a non-inverting input and an output. The inverting input is coupled to a first resistor for converting the other drive current into a voltage. The output is coupled to the base of a transistor whose collector is coupled to a second resistor and to the non-inverting input of the operational amplifier. The emitter of this transistor is coupled to an output for supplying the compensation current. If the first resistor is a variable resistor, this makes it possible to adjust the magnitude of the compensation current and hence of the light level corresponding to a logic "0".

BRIEF DESCRIPTION OF THE DRAWING

Embodiments of the invention will now be described in more detail, by way of example, with reference to the accompanying drawings, in which:

FIG. 4a shows schematically an example of a compensation device for use in the device shown in FIG. 1, and FIG. 4b shows a practical example of the device shown in FIG. 4a.

DESCRIPTION OF THE PREFERRED EMBODIMENTS

Figure 1:
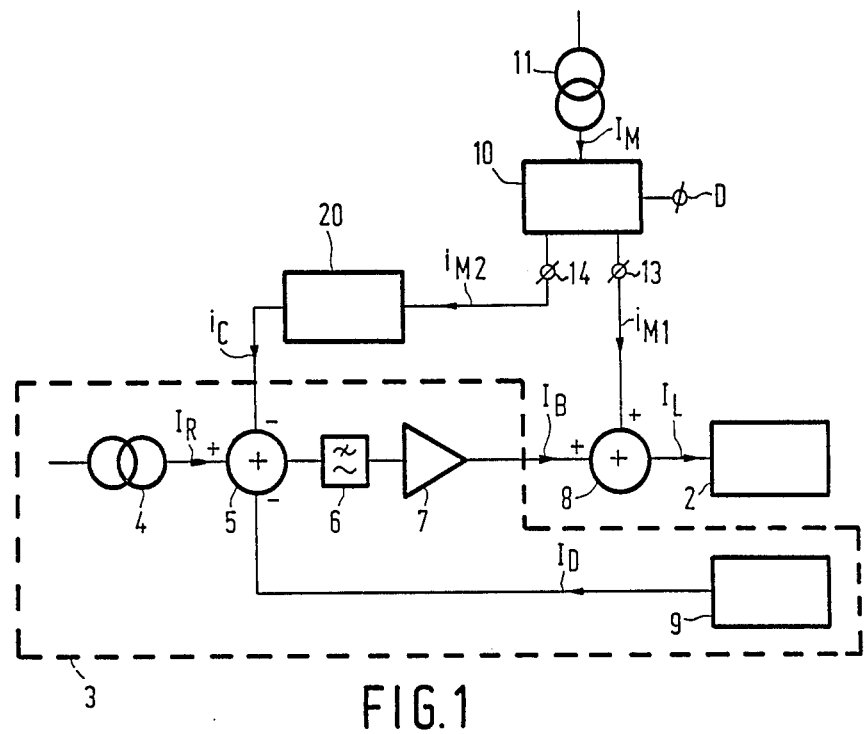
FIG. 1 shows the basic diagram of a device in accordance with the invention.
Figure 2:
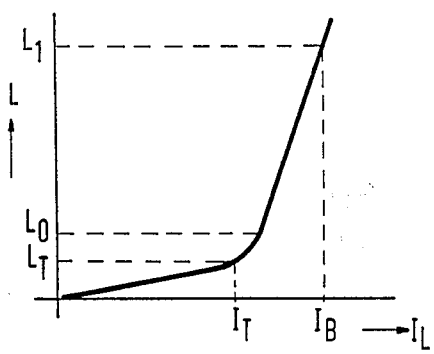
FIG. 2 schematically shows the light/current characteristic of a laser in order to explain the operation of the device shown in FIG. 1.

FIG. 1 shows the basic diagram of a device in accordance with the invention for driving a laser with a digital input signal D. The device comprises a diode laser 2, shown schematically. FIG. 2 shows the light/current characteristic of such a laser, in which characteristic the light output L of the laser is plotted as a function of the total laser current $I_L$. This characteristic has a first range of substantially constant slope $n_1$ where the light output L hardly increases as the laser current $I_L$ increases. Above a specific threshold value $I_T$ this range changes into a second range of substantially constant slope $n_2$ where the light output L increases substantially as the laser current $I_L$ increases. The digital input signal D should now modulate the laser current $I_L$ in such a way that in the case of a logic "0" the light output of the laser is substantially equal to $L_o$, which value lies just above the threshold value $L_T$, and in the case of a logic "1" the light output is $L_1$. In accordance with the invention the laser is operated at the value $L_1$. This is achieved by quiescent-current means 3, which supply a quiescent current $I_B$ to the laser 2. The quiescent-current means 3 comprise a reference-current source 4 which supplies a reference current $I_R$ to a current amplifier 7 via a first summing device 5 and a low-pass filter. The current amplifier 7 amplifies said current to substantially the value $I_B$. This quiescent current $I_B$ sets the light output of the laser 2 to the level $L_1$. In order to stabilize this level $L_1$ against variations in laser parameters, a current $I_D$ which is proportional to the light output of the laser 2 is generated by means of a photodetector 9. The current $I_D$ is subtracted from the reference current $I_R$ by means of the summing device 5. As a result of this negative feedback the quiescent current $I_B$ is controlled in such a way that the current $I_D$ and hence the light output $L_1$ remain substantially constant. The device further comprises a modulation device 10 which, in accordance with the invention, is constituted by a balanced converter. A direct current $I_M$ from a current source 11 is applied to this converter in order to be converted into two output currents by the digital input signal D, which output currents, apart from possible equal d.c. components comprise mutually equal but opposite phase signal components. If the total current at output 13 is $i_{M1}$, the current at output 14 is equal to $i_{M2} = I_M - i_{M1}$. The current $i_{M1}$ on output 13 is applied to the laser 2 via a second summing device 8, while the current on output 14 is applied to a compensation device 20. However, the negative feedback which stabilizes the light output $L_1$ of the laser 2 with respect to low-frequency variations in the laser parameters also suppresses the low-frequency component of the drive current $i_{M1}$, which low-frequency component depends on the duty cycle. The conversion of the reference current $I_R$ into the current $I_D$ of photodetector 9 complies with:

$$I_D = \frac{K}{1 + AK} \cdot i_{M1,LF} + \frac{AK}{1 + AK} \cdot I_R$$

where
  A = the current gain factor of the current amplifier 7,
  K = the proportionality factor between the diode current $I_D$ and laser current $I_L$ and
  $i_{M1,LF}$ = the low-frequency component of the drive current $i_{M1}$.

For AK>>1, which is always the case in practice, it follows from the above equation that $I_D \approx I_R$, which means that the low-frequency component $i_{M1}$ is suppressed. It is to be noted that the highest frequency which is suppressed is dictated by the cut-off frequency of the low pass filter 6. The high-frequency component of $i_{M1}$, containing the actual information, sees an open loop and is transferred to the laser without attenuation. As stated, the low-frequency component of the drive current $i_{M1}$ is determined by the duty cycle of the digital input signal D. In the case of a digitaal input signal comprising only "ones" a maximum low-frequency component is obtained which is substantially equal to the value of the drive current $i_{M1}$ in the case of a logic "1", whereas in the case of a digital input signal comprising only logic "zeros" this low-frequency component is minimal and is equal to the value of the drive current $i_{M1}$ for a logic "0". As the laser 2 is operated at the level $L_1$ the laser would be driven to a value $L_1 - L_0$ above the operating level $L_1$ when the input signal comprises only logic "ones". However, as the low-frequency component of the drive current $i_{M1}$ is suppressed almost completely the light output is reduced by substantially the value $L_1$, so that the light output of the laser 2 nevertheless reaches the value $L_1$.

In the case of a logic "0" the light output of the laser 2 should be reduced from the level $L_1$ to the level $L_0$. For this purpose the current $i_{M2}$ on the output 14 of the modulation device 10 is used. The current $i_{M2}$ is applied to the compensation device 20, which feeds a fraction of this current to the first summing device 5 as a compensation current $i_c$, which current $i_c$ is subtracted from the reference current $I_R$. The current $i_{M2}$ is in phase opposition to the drive current $i_{M1}$. In the case of a logic "1", the compensation current $i_c$ is minimal and may be zero. After amplification the difference between the reference current $I_R$ and the compensation current $i_c$ constitutes the quiescent current $I_B$ by means of which the laser 2 is set to the level $L_1$. In the case of a logic "0" the compensation current $i_c$ is maximal. As a result of this, the quiescent current $I_B$ is reduced and consequently the laser 2 is operated at the level $L_0$.

Figure 3:
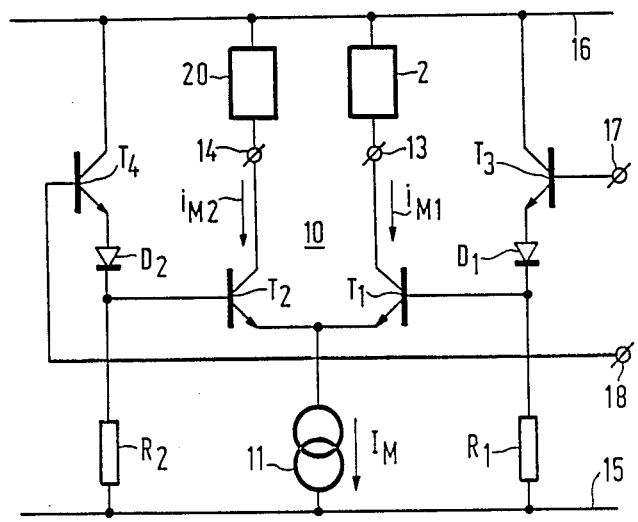
FIG. 3 shows an example of a modulation device for use in the device shown in FIG. 1.

FIG. 3 shows an example of a modulation device for use in the device shown in FIG. 1. The device comprises a differential amplifier comprising two transistors $T_1$ and $T_2$, whose common emitter terminal is connected to the negative power-supply line 15 by a current source 11 which can supply a current $I_M$. The collector of the transistor $T_1$ constitutes the output 13, which is connected to the laser 2 and the collector of the transistor $T_2$ constitutes the output 14, which is connected to the compensation device 20. The transistor $T_1$ is driven via an emitter-follower arrangement comprising a transistor $T_3$ whose emitter is connected to the base of the transistor $T_1$ via a level-shifting diode $D_1$ and to the negative power-supply line 15 via a resistor $R_1$. The collector of the transistor $T_3$ is connected to the positive power-supply line 16. The transistor $T_2$ is driven in a similar way by the transistor $T_4$, the diode $D_2$ and the resistor $R_2$. The bases 17 and 18 of the transistors $T_3$ and $T_4$ constitute the input terminals for receiving the digital input signal D. The bases 17 and 18 can be biassed to a d.c. level of 1.3 V in order to render the circuit arrangement compatible with ECL circuits. In the quiescent state the current $I_M$ from the current source 11 is distributed equally between the transistors $T_1$ and $T_2$. If the voltage on the base 17 of the transistor $T_3$ is sufficiently positive relative to the voltage on the base of the transistor $T_4$ when a logic "1" is applied, the transistor $T_2$ is fully cut off and the entire current $i_{M2}$ flows through the transistor $T_1$. In this case the quiescent current $i_{M1}$ is maximal and is equal to $i_{M1} = I_M$. The current $i_{M2}$ for the compensation device 20 is then minimal and is equal to zero. In the case of a logic "0" the voltage on the base 18 is positive relative to that on the base 17. The current $I_M$ then flows entirely through the transistor $T_2$. The drive current $i_{M1}$ for the laser 2 is then zero, while the current $i_{M2}$ for the compensation device 20 is maximal and is equal to $i_{M2} = I_M$. In the case of comparatively low input voltages the differential amplifier $T_1$, $T_2$ does not operate as a switched amplifier but as a linear amplifier. In the case of a logic "1" the current in the transistor $T_1$ is then equal to $i_{M1} = I_M + i_s$ and the current through the transistor $T_2$ is equal to $i_{M2} = I_M - i_s$, where $i_s$ is the signal current as a result of the application of the digital input signal. In the case of a logic "0" the currents through the transistor $T_1$ and $T_2$ are equal to $i_{M1} = I_M - i_s$ and $i_{M2} = I_M + i_s$ respectively.

FIG. 4 shows schematically an example of a compensation device for use in the arrangement shown in FIG. 1. In this arrangement the transistor $T_2$ of FIG. 3 is represented schematically by a current source which can supply a current $i_{M2}$. The output 14 of this current source is connected to the positive power-supply line 16 by a resistor $R_3 = R_x$ and also to the inverting input of an operational amplifier 21 whose output drives a transistor $T_5$. The collector of this transistor $T_5$ is connected to the positive power-supply line 16 by a resistor $R_4 = R_0$ and to the non-inverting input of the amplifier 21. The emitter of the transistor $T_5$ constitutes the output of the compensation device 20, which supplies the compensation current $i_c$. The amplifier 21 now drives the transistor $T_5$ in such a way that the voltage across the resistors $R_3$ and $R_4$ is the same. The compensation current is then equal to $i_c = R_x \cdot i_{M2}/R_0$. If the resistor $R_3$ is a variable resistor the magnitude of the compensation current $i_c$ can be adjusted.

Figures 4A, 4B:
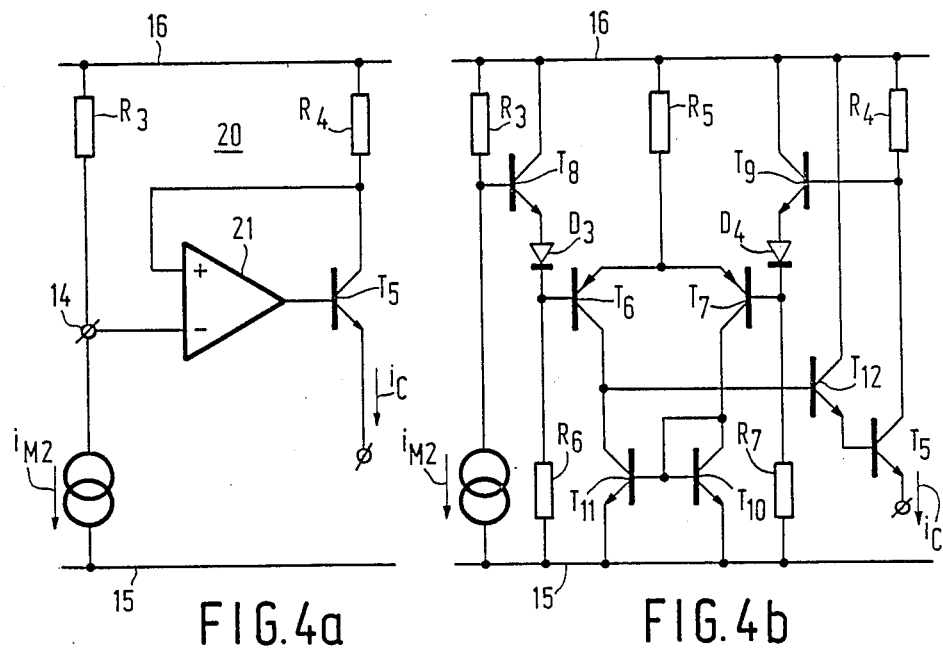

FIG. 4b shows a practical example of the arrangement shown in FIG. 4a. The operational amplifier 21 comprises two PNP transistors $T_6$, $T_7$ arranged as a differential pair, whose common emitter terminal is connected to the positive power-supply line 16 by a resistor $R_5$ which functions as a current source. The base of the transistor $T_6$ is connected to the output 14 of the current source $i_{M2}$ via an emitter-follower arrangement comprising a transistor $T_8$, a diode $D_3$ and a resistor $R_6$, while the base of the transistor $T_7$ is connected to one end of the resistor $R_4$ via a similar emitter-follower arrangement comprising a transistor $T_9$, a diode $D_4$ and a resistor $R_7$. The base of the transistor $T_8$ constitutes the inverting input and the base of the transistor $T_9$ constitutes the non-inverting input of the amplifier 21. By means of a current mirror comprising the transistors $T_{10}$ and $T_{11}$ the collector of the transistor $T_7$ is connected to the collector of transistor $T_6$ and to the base of a transistor $T_5$. The arrangement operates in the same way as the arrangement shown in FIG. 4a.

The scope of the invention is not limited to the embodiments described above. The construction of the push-pull converter and that of the compensation device are irrelevant to the inventive principle and therefore these devices may be realized in various ways. Further, the device may comprise a protection circuit which limits the quiescent current of the laser to a maximum value in the case of degradation of the laser.

What is claimed is:

1. A device for driving a laser with a digital input signal, comprising:

quiescent-current means for applying to the laser a quiescent current which is controlled by a negative feedback current proportional to the light output of the laser thereby to stabilize the light output of the laser at a level which corresponds to one of two possible values of the digital input signal, a modulation device having input means that receive said digital input signal and means for applying to said laser a drive current modulated by the digital input signal, and a compensation device for applying a compensation current to the quiescent current means in order to compensate for a d.c. component of the drive current, which component varies with the duty cycle of the digital input signal, characterized in that the quiescent-current means stabilize the light output of the laser at a level corresponding to a high value of the digital input signal, said modulation device comprises a converter for converting the digital input signal into two drive currents that have equal amplitudes but are in phase opposition, and one drive current is applied to the laser and the other drive current is supplied to the compensation device.

2. A device as claimed in claim 1, characterized in that said converter comprises a differential amplifier including two emitter-coupled transistors whose bases are coupled to said input means for receiving the digital input signal and whose collectors are coupled to output terminals for supplying said one and said other drive current.

3. A device as claimed in claim 2, characterized in that the compensation device comprises an operational amplifier having an inverting input, a non-inverting input and an output, said inverting input being coupled to a first resistor for converting the other drive current into a voltage, means coupling the output of the operational amplifier to the base of a transistor having a collector coupled to a second resistor and to the non-inverting input of the operational amplifier, and means coupling the emitter of the transistor to an output for supplying the compensation current to said quiescent current means.

4. A device as claimed in claim 3, characterized in that the first resistor is a variable resistor.

5. A device as claimed in claim 1, wherein the compensation device comprises an operational amplifier having an inverting input, a non-inverting input and an output, said inverting input being coupled to a first resistor for converting said other drive current into a voltage, means coupling the output of the operational amplifier to a base of a transistor having a collector coupled to a second resistor and to the non-inverting input of the operational amplifier, and means coupling the emitter of the transistor to an output for supplying the compensation current to said quiescent current means.

6. A device for driving a laser with a digital input signal comprising:
a modulation device having an input for receiving said digital input signal and a converter for converting the digital input signal into first and second equal but opposite-phase drive currents modulated by said digital input signal,
quiescent current means for applying to an input of the laser a quiescent current to control the light output of the laser at a level corresponding to a high value of the dual value digital input signal,
means for stabilizing the light output of the laser at said level by adjusting the quiescent current by feedback of a current proportional to the light output of the laser to a first control input of said quiescent current means, and
means for applying said first drive current to said laser input and said second drive current to an input of a compensation device,
said compensation device applying a compensation current to a second control input of said quiescent current means to adjust said quiescent current so as to compensate for a DC component of the drive current that varies with the duty cycle of the digital input signal.

7. A device as claimed in claim 6 wherein said converter comprises a differential amplifier including two emitter-coupled transistors whose bases are coupled to said input of the modulation device and whose collectors are coupled to respective first and second output terminals for supplying said first and second drive currents.

8. A device as claimed in claim 6 wherein said compensation device comprises:
an operational amplifier having an inverting input, a non-inverting input and an output,
means coupling said inverting input to said input of the compensation device and to a first resistor for converting said second drive current into a voltage,
means coupling said operational amplifier output to a base of a transistor having a collector coupled to a second resistor and to the non-inverting input of the operational amplifier, and
means coupling an emitter of said transistor to an output for supplying said compensation current to said second control input of the quiescent current means.

9. A device as claimed in claim 6 wherein the quiescent current means comprises:
a source of reference current,
a summing device having first and second inputs that constitute said first and second control inputs, respectively,
means coupling the summing device, a low-pass filter and an amplifier in cascade between an output of said reference current source and said input of the laser, and wherein
said stabilizing means comprise a light responsive device for converting light output of the laser to a negative feedback current that is applied to said first input of the summing device.

* * * * *